United States Patent
Takamura et al.

(10) Patent No.: US 6,841,920 B2
(45) Date of Patent: Jan. 11, 2005

(54) METHOD AND APPARATUS FOR DRIVING CAPACITIVE ELEMENT

(75) Inventors: Jun Takamura, Mishima (JP); Noboru Nitta, Shizuoka-ken (JP); Shunichi Ono, Shizuoka-ken (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 177 days.

(21) Appl. No.: 09/951,196

(22) Filed: Sep. 13, 2001

(65) Prior Publication Data

US 2002/0033644 A1 Mar. 21, 2002

(30) Foreign Application Priority Data

Sep. 19, 2000 (JP) ........................................ 2000-284245

(51) Int. Cl.$^7$ .............................................. H01L 41/09
(52) U.S. Cl. .................................. 310/316.03; 310/317
(58) Field of Search ........................... 310/316.03, 317; 331/108 C, 116 R, 158

(56) References Cited

U.S. PATENT DOCUMENTS

| | | | | |
|---|---|---|---|---|
| 4,068,461 A | * | 1/1978 | Fassett et al. ................. | 368/73 |
| 4,714,935 A | | 12/1987 | Yamamoto et al. ............ | 347/10 |
| 5,208,505 A | * | 5/1993 | Mitsuyasu .................... | 310/317 |
| 5,266,965 A | * | 11/1993 | Komai et al. .................. | 347/12 |
| 5,384,583 A | * | 1/1995 | Katerberg et al. ............. | 347/19 |
| 5,493,543 A | * | 2/1996 | Kamens ........................ | 368/255 |
| 5,801,596 A | * | 9/1998 | Sakurai ........................ | 331/176 |
| 6,068,360 A | * | 5/2000 | Hiwada ......................... | 347/14 |
| 6,121,715 A | * | 9/2000 | Hoffmann et al. ....... | 310/316.03 |
| 6,259,292 B1 | * | 7/2001 | Congdon ...................... | 327/206 |
| 6,433,459 B1 | * | 8/2002 | Okada ........................... | 310/317 |

FOREIGN PATENT DOCUMENTS

| | | | |
|---|---|---|---|
| JP | 59-224356 | 12/1984 | ............. B41J/3/04 |
| JP | 05-347545 A | 12/1993 | .......... H03K/17/16 |
| JP | 5-347545 | 12/1993 | .......... H03K/17/16 |
| JP | 07-178898 A | 7/1995 | ............ B41J/2/045 |
| JP | 7-178898 | 7/1995 | ............ B41J/2/045 |
| JP | 2001-10043 A | 1/2001 | ............ B41J/2/045 |

OTHER PUBLICATIONS

U.S. Appl. No. 09/559,964 filed Apr. 27, 2000, entitled Capacitive Element Driving Apparatus, inventor: J. Takamura, et al.

U.S. Patent Office Action dated Oct. 4, 2001 issued in related U.S. Appl. No. 09/559,864, filed Apr. 27, 2000; Applicants: Jun Takamura et al. Title: Capacitive Element Driving Apparatus.

* cited by examiner

*Primary Examiner*—Thomas M. Dougherty
(74) *Attorney, Agent, or Firm*—Frishauf, Holtz, Goodman & Chick, P.C.

(57) ABSTRACT

A method and apparatus for driving a capacitive element are provided wherein: (i) when charging the capacitive element by driving and controlling both electrodes of the capacitive element, the capacitive element is charged by setting one of the driving circuits for varying one of the electrode potentials first at a high impedance and then at a low impedance; and (ii) when discharging the capacitive element by driving and controlling both electrodes of the capacitive element, the capacitive element is discharged by setting one of the driving circuits for varying one of the electrode potentials first at a high impedance and then at a low impedance.

7 Claims, 12 Drawing Sheets

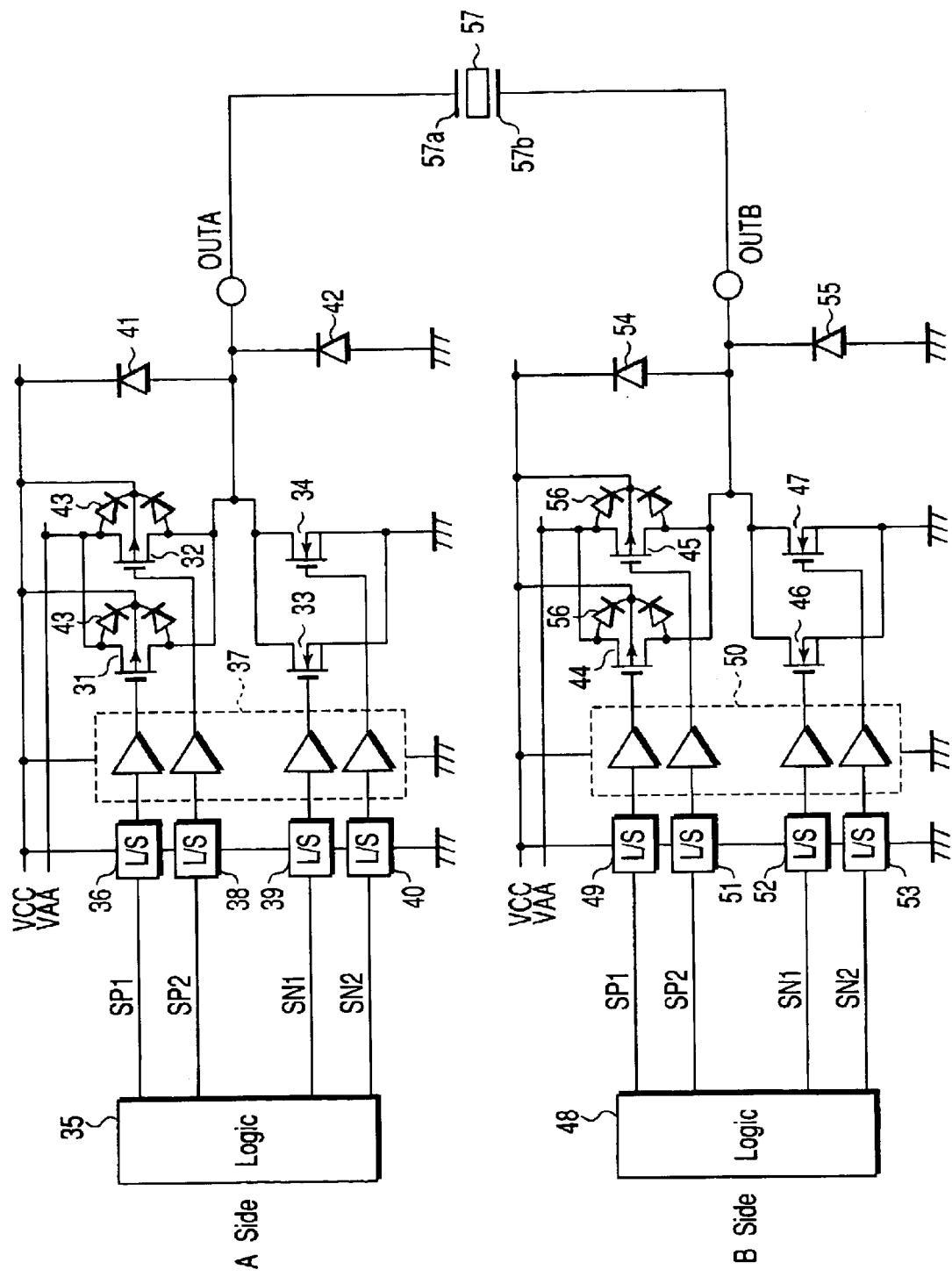
F I G. 1

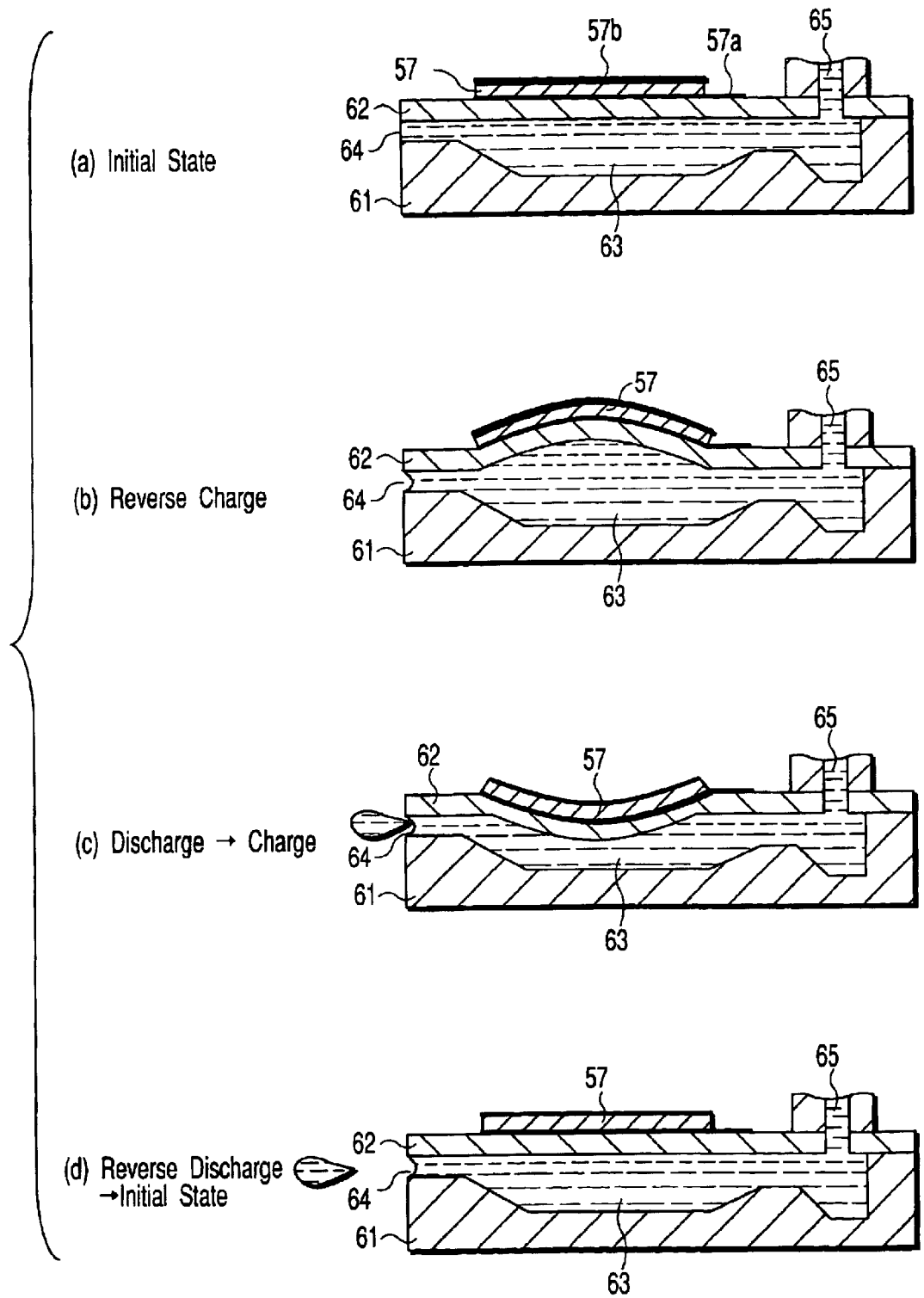
F I G. 2

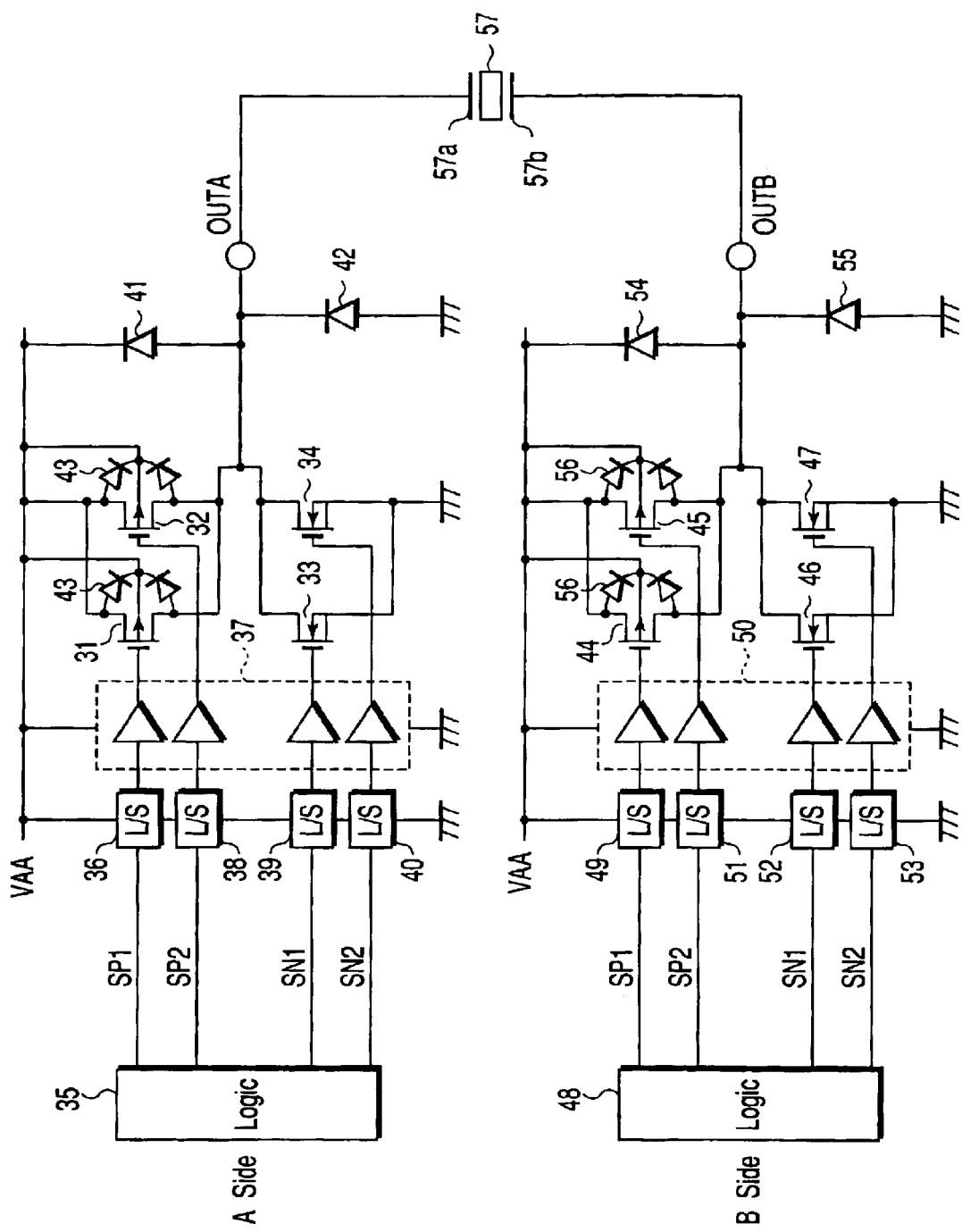
F I G. 4

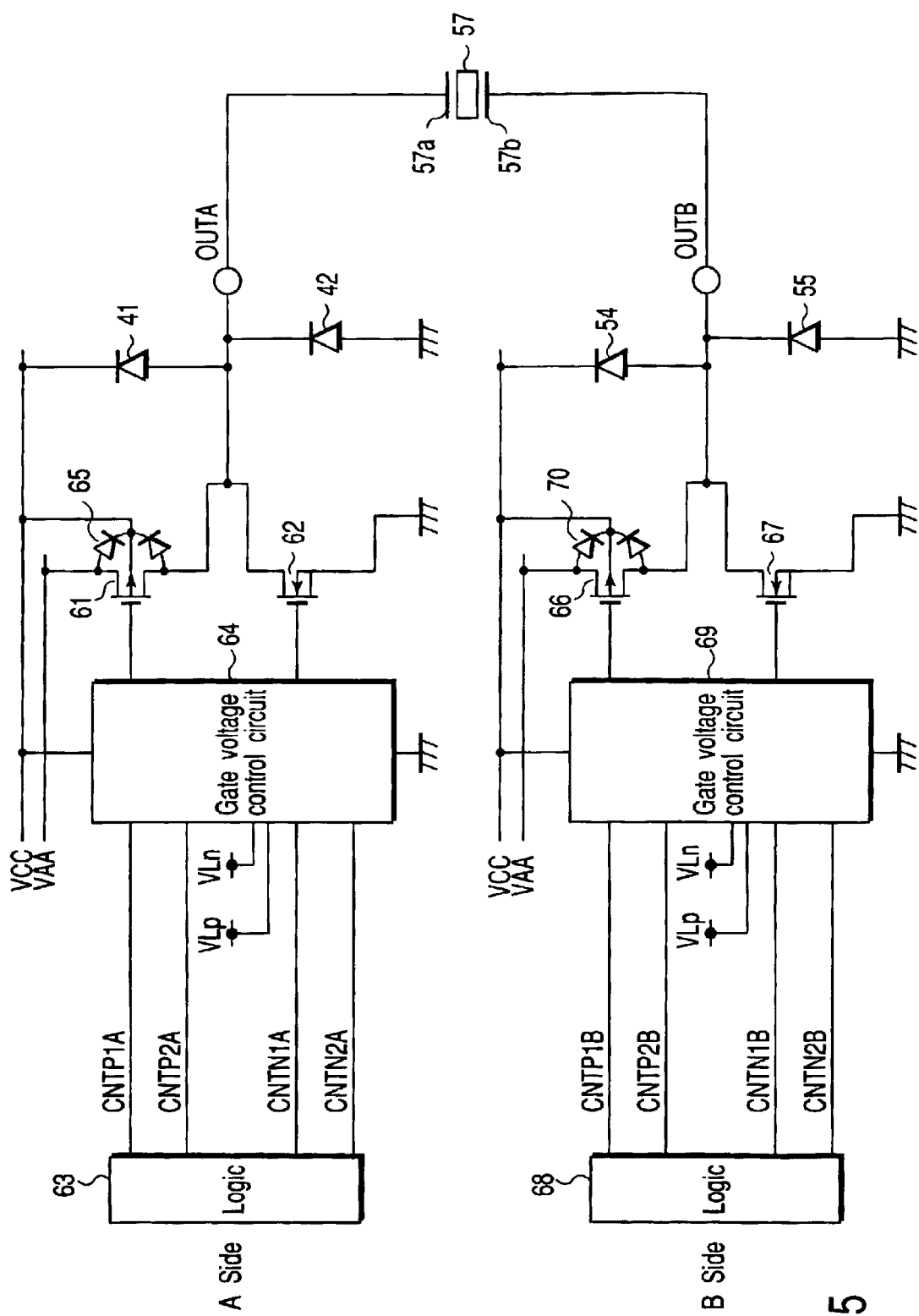
F I G. 5

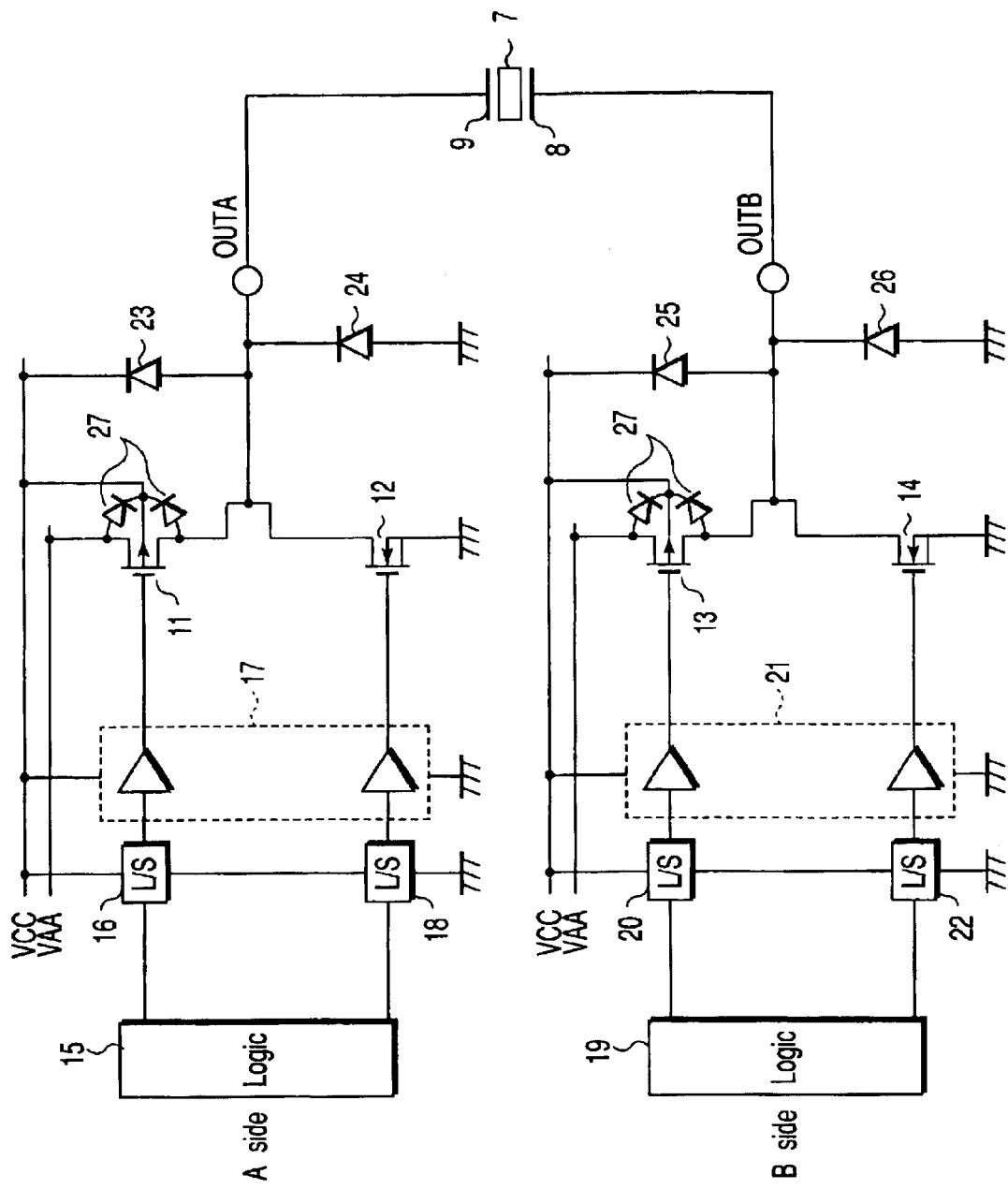
F I G. 15

METHOD AND APPARATUS FOR DRIVING CAPACITIVE ELEMENT

CROSS-REFERENCE TO RELATED APPLICATIONS

This application is based upon and claims the benefit of priority from the prior Japanese Patent Application No. 2000-284245, filed Sep. 19, 2000, the entire contents of which are incorporated by reference.

BACKGROUND OF THE INVENTION

1. Field of the Invention

The present invention relates to a method and apparatus for driving a capacitive element such as a piezoelectric element or a liquid crystal element, etc.

2. Description of the Related Art

An apparatus for driving a capacitive element is known from, for example, Japanese Patent Application KOKAI Publication No. 59-224356. This apparatus will be described with reference to FIG. 13. As shown in FIG. 13, DC power supply V1 is connected to a series circuit of PNP transistor 1, variable resistor 5 and NPN transistor 2. DC power supply V2 is connected to a series circuit of PNP transistor 3, variable resistor 6 and NPN transistor 4. A piezoelectric element 7 as a capacitive element is connected between the collectors of the transistors 2 and 4. The piezoelectric element 7 surrounds the outer wall of the pressure chamber of a jet head. A timing pulse (/b) obtained by inverting the waveform shown in (b) of FIG. 14 is input to the bases of the transistors 1 and 2. A timing pulse (/a) obtained by inverting the waveform shown in (a) of FIG. 14 is input to the bases of the transistors 3 and 4.

When the transistors 1 and 4 are in the OFF state and the transistors 2 and 3 are in the ON state at time point t1, the positive electrode 8 of the piezoelectric element 7 is grounded, whereby positive driving voltage V2 is applied to the negative electrode 9 of the element 7 via the variable resistor 6. Since thus, a voltage is applied to the piezoelectric element 7 in a direction opposite to the polarization direction of the element 7, the element 7 is expanded and hence the volume of an ink chamber is increased. When the transistors 2 and 3 are turned off and the transistors 1 and 4 are turned on at time point t2, which is time period T1 later than the time point t1, the negative electrode 9 of the piezoelectric element 7 is grounded, and positive driving voltage V1 is applied to the positive electrode 8 via the variable resistor 5. Since thus, a voltage is applied to the piezoelectric element 7 in the same direction as the polarization direction of the element 7, the element 7 is contracted and hence the volume of the ink chamber is reduced, thereby discharging a recording liquid drip, i.e. ink, from the jet head.

When, at time point t3, which is time period T2 later than the time point t2, the transistor 1 is turned off, the transistor 3 is kept in the OFF state, the transistor 2 is turned on, and the transistor 4 is kept in the ON state, both the electrodes 8 and 9 of the piezoelectric element 7 are grounded, and therefore, the element 7 is returned to its initial state.

If this driving apparatus is configured using MOS transistors, a configuration as shown in FIG. 15 is obtained. Specifically, a series circuit of PMOS transistor 11 and NMOS transistor 12, and a series circuit of PMOS transistor 13 and NMOS transistor 14 are connected between a driving voltage VAA and the ground. A signal from logic circuit 15 is supplied to the gate of the PMOS transistor 11 via level shifter (L/S) 16 and pre-buffer 17. The signal from logic circuit 15 is also supplied to the gate of the NMOS transistor 12 via level shifter (L/S) 18 and the pre-buffer 17. Further, a signal from logic circuit 19 is supplied to the gate of the PMOS transistor 13 via level shifter (L/S) 20 and pre-buffer 21. The signal from logic circuit 19 is also supplied to the gate of the NMOS transistor 14 via level shifter (L/S) 22 and the pre-buffer 21.

The level shifter 16, level shifter 18 and pre-buffer 17, and level shifter 20, level shifter 22 and pre-buffer 21 are connected between the substrate potential VCC (>VAA) of the PMOS transistor 11 and PMOS transistor 13 and the ground. Reference numerals 23, 24, 25 and 26 denote protective diodes for the MOS transistors 11, 12, 13 and 14, respectively. The PMOS transistor 11 and PMOS transistor 13 are connected to the substrate potential VCC via parasitic diodes 27.

The logic circuit 15, level shifter 16, level shifter 18, pre-buffer 17, MOS transistor 11 and MOS transistor 12 configure an A-side driving circuit having its output terminal OUTA connected to the electrode 9 of the piezoelectric element 7. The logic circuit 19, level shifter 20, level shifter 22 pre-buffer 21, MOS transistor 13 and MOS transistor 14 configure a B-side driving circuit having its output terminal OUTB connected to the electrode 8 of the piezoelectric element 7.

In the above-described driving apparatus, when the signals shown in (a), (b), (c) and (d) of FIG. 16 are supplied to the gates of the PMOS transistor 11, the NMOS transistor 12, the PMOS transistor 13 and the NMOS transistor 14, respectively, the voltage waveforms shown in (e) and (f) of FIG. 16 occur at the output terminals OUTA and OUTB of the A-side driving circuit and the B-side driving circuit, respectively. As a result, the driving waveform shown in (g) of FIG. 16 is applied between the electrodes 8 and 9 of the piezoelectric element 7.

Specifically, in a steady state, the PMOS transistors 11 and 13 are kept in the ON state, and the NMOS transistors 12 and 14 are kept in the OFF state, thereby applying the voltage VAA to each of the electrodes 8 and 9 of the piezoelectric element 7. If the PMOS transistor 11 is turned off, and the NMOS transistor 12 is turned on at time point t1 which is slightly later than the turn-off of the transistor 11, the electrodes 9 and 8 are set at low and high levels, respectively, thereby expanding the ink chamber.

This state is maintained for a while, and the NMOS transistor 12 is turned off slightly before time period T1 elapses. At time point t2 after the time period T1 elapses, the PMOS transistor 11 is turned on to raise the potential of the electrode 9. When the PMOS transistor 13 is turned off slightly before a certain time period elapses, and the NMOS transistor 14 is turned on at time point t2' after the certain time period elapses, the electrodes 8 and 9 are set at low and high levels, respectively, thereby contracting the ink chamber and discharging ink therefrom.

The reason why the potential of the electrode 8 is reduced when the potential of the electrode 9 is raised to a certain degree is to avoid a case where when the potential of the electrode 8 is reduced before the potential of the electrode 9 sufficiently rises, the potential of the electrode 9 is induced to the minus side by the potential reduction of the electrode 8 via the piezoelectric element 7. If the potential of the electrode 9 shifts to the minus side, current flows from the substrate of the NMOS transistor 12 at the electrode 9 side toward the electrode 9, thereby, for example, disadvantageously activating the parasitic element. Moreover, when the potential of the electrode 9 rises, an induced voltage occurs in the electrode 8. This excessively increases the level at the electrode 8, which is already at a high level. In light of this, it is necessary to set the substrate potential VCC, applied to the PMOS transistor 13, at a level higher than the excessively increased level, so that no current will flow into the substrate of the PMOS transistor 13 at the electrode 8 side.

Further, when the NMOS transistor 14 is turned off slightly before time period T2 elapses from the time point t2', and the PMOS transistor 13 is turned on at time point t3 after the time period T2 elapses, the potential of the electrode 8 rises. Then, the potential of the electrode 8 is increased to a level identical to that of the electrode 9, whereby the piezoelectric element 7 is returned to its original state.

Then, the potential of the electrode 8 is raised, thereby inducing a voltage in the electrode 9. As a result, the level of the electrode 9, which is already at a high level, is excessively increased. In order to prevent a current from flowing into the substrate of the PMOS transistor 11 at the electrode 9 side, it is necessary to set the substrate potential VCC applied to the PMOS transistor 11 at a level higher than the excessively increased level.

As described above, in the driving apparatus using the MOS transistors, its breakdown voltage is determined from a voltage to which the one of the electrodes of the piezoelectric element, which is already at a high level, is excessively increased when the potential of the other electrode is raised. In the prior art, this increased voltage is too high, and therefore it is necessary to set, at a high level obtained by adding the increased voltage to the driving voltage VAA, the potential VCC that is to be applied to the PMOS substrate when the substrate is increased to a level higher than the driving voltage VAA. On the other hand, if the upper limit is given to the substrate potential VCC, the driving voltage VAA must be set at a low level.

In light of the above, there is a need for a method and apparatus for a capacitive element, which can suppress the peak value of the induced voltage that occurs in an electrode when charging and discharging the capacitive element, and can set a driving voltage for the capacitive element at a higher level.

BRIEF SUMMARY OF THE INVENTION

According to an aspect of the present invention, when charging the capacitive element by driving and controlling both electrodes of the capacitive element, the capacitive element is charged by setting one of the driving circuits for varying one of the electrode potentials first at a high impedance and then at a low impedance. When discharging the capacitive element by driving and controlling both electrodes of the capacitive element, the capacitive element is discharged by setting one of the driving circuits for varying one of the electrode potentials first at a high impedance and then at a low impedance.

BRIEF DESCRIPTION OF THE SEVERAL VIEWS OF THE DRAWING

The accompanying drawings, which are incorporated in and comprise a part of the specification, illustrate embodiments of the invention, and together with the general description given above and the detailed description of the embodiments given below, serve to explain the principles of the invention.

FIG. 1 is a circuit diagram according to a first embodiment of the invention;

Figure 3:
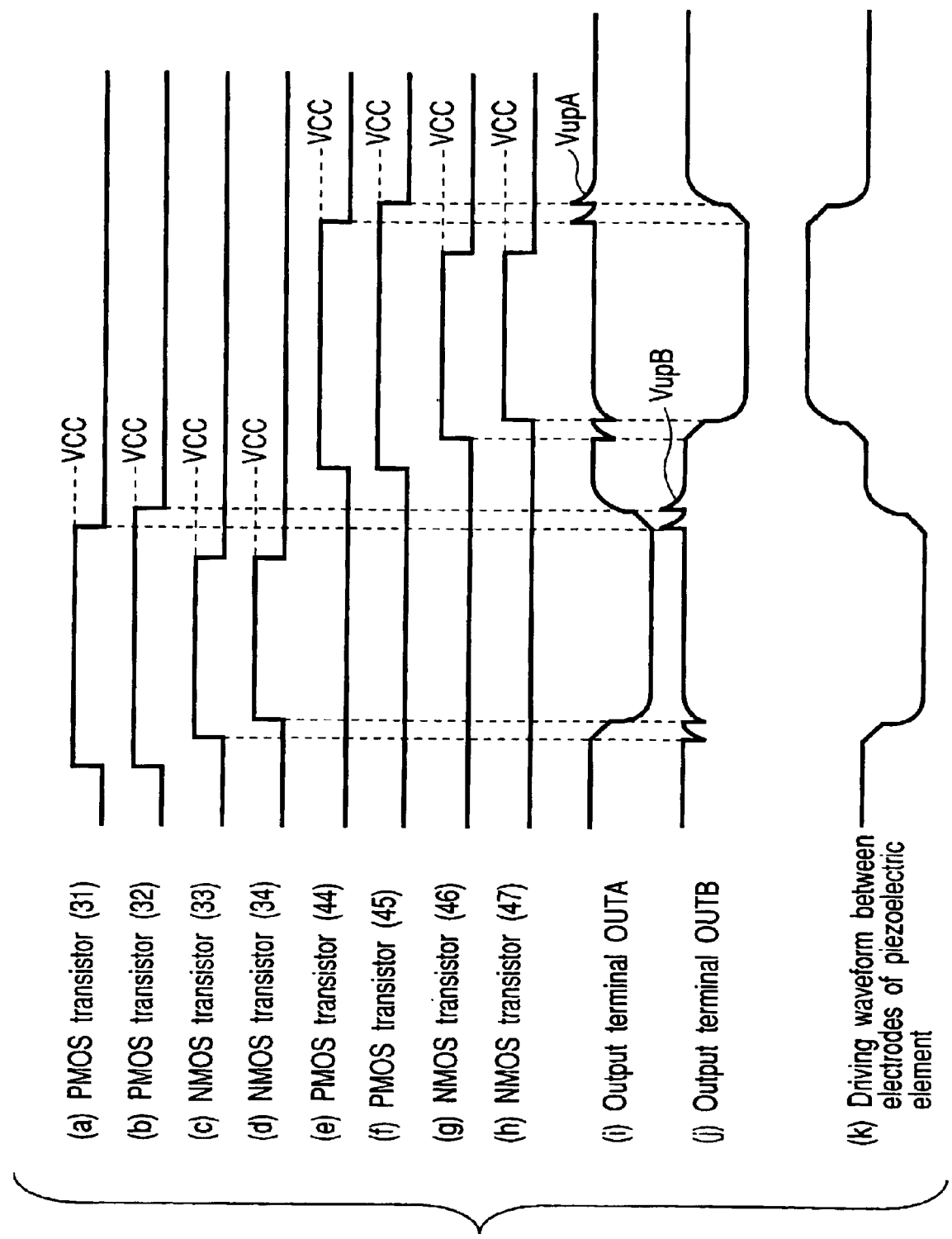
Figure 6:
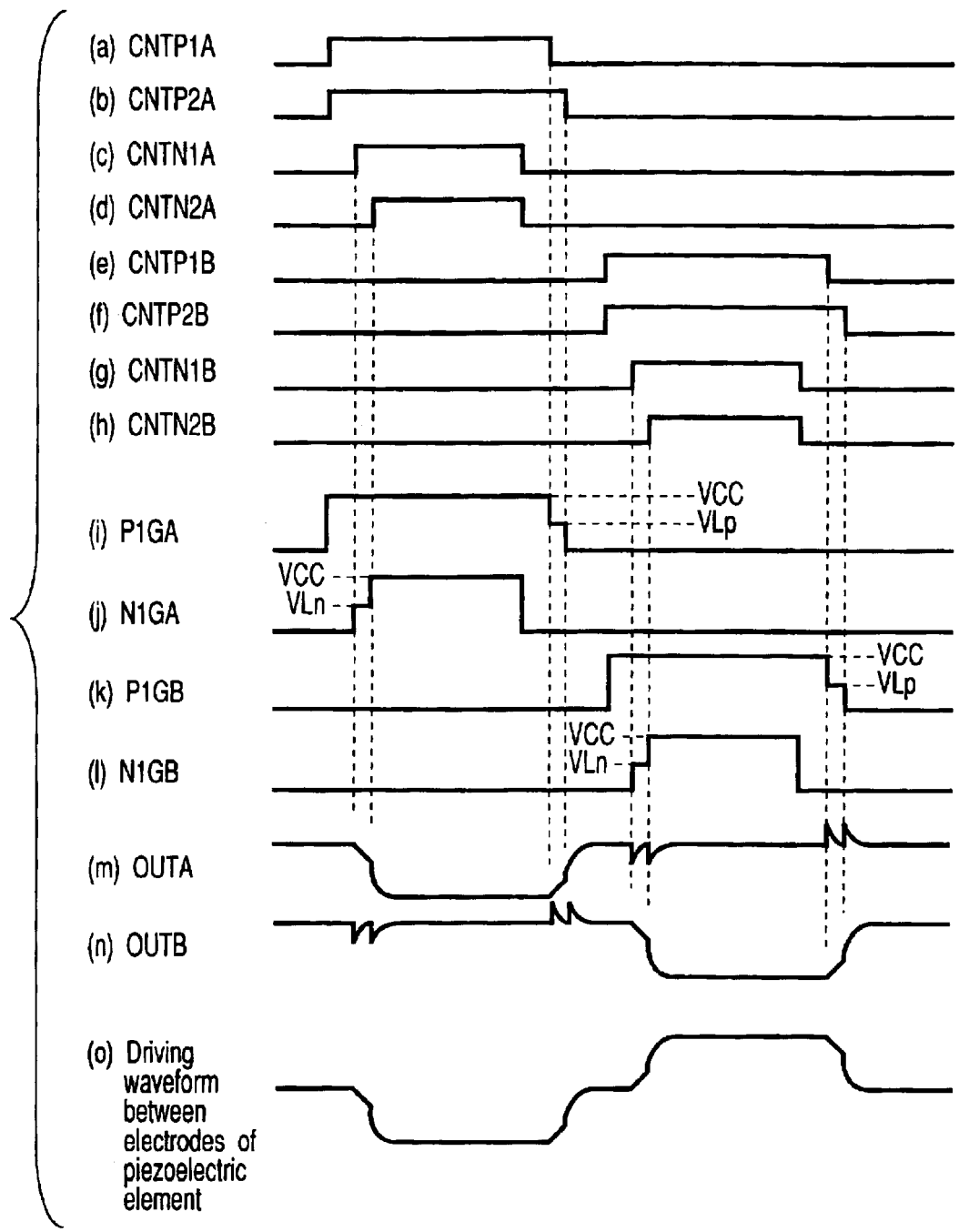
Figure 7:
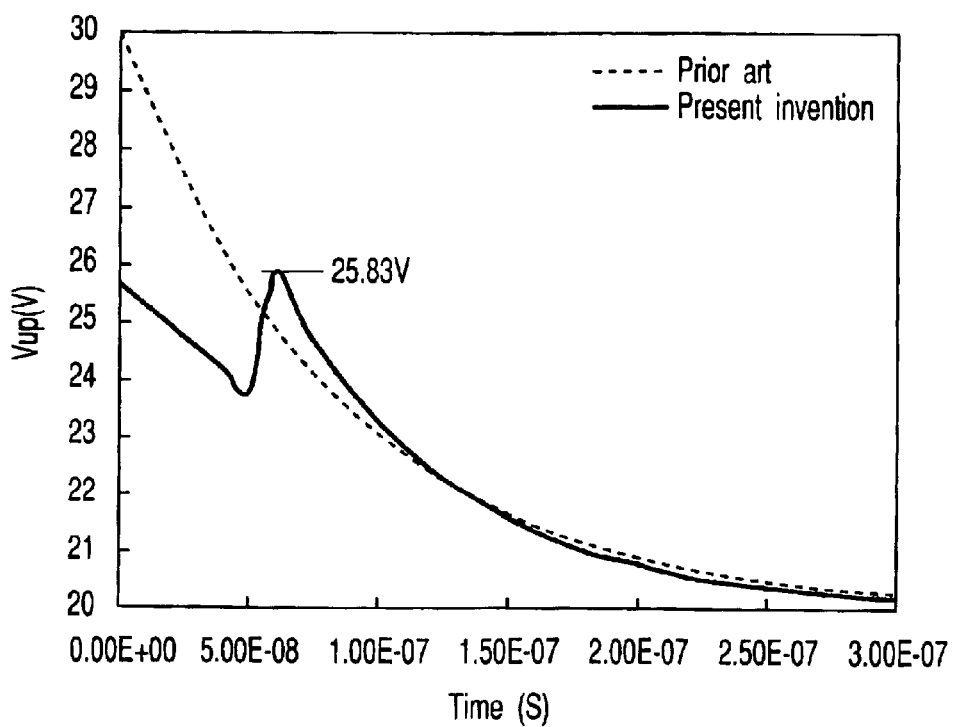
Figure 8:
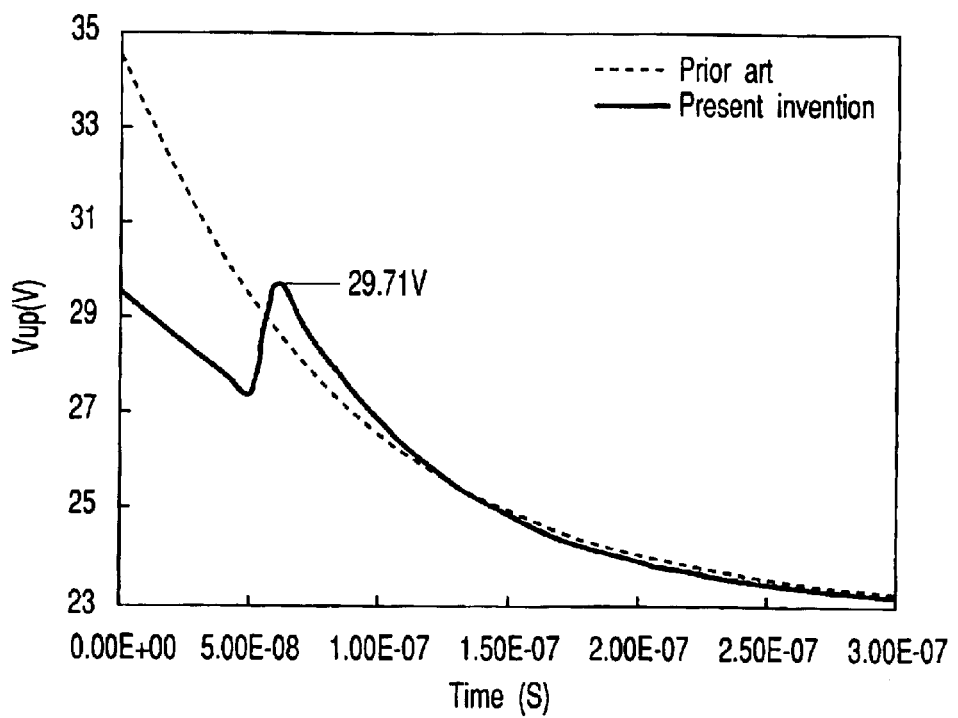
Figure 9:
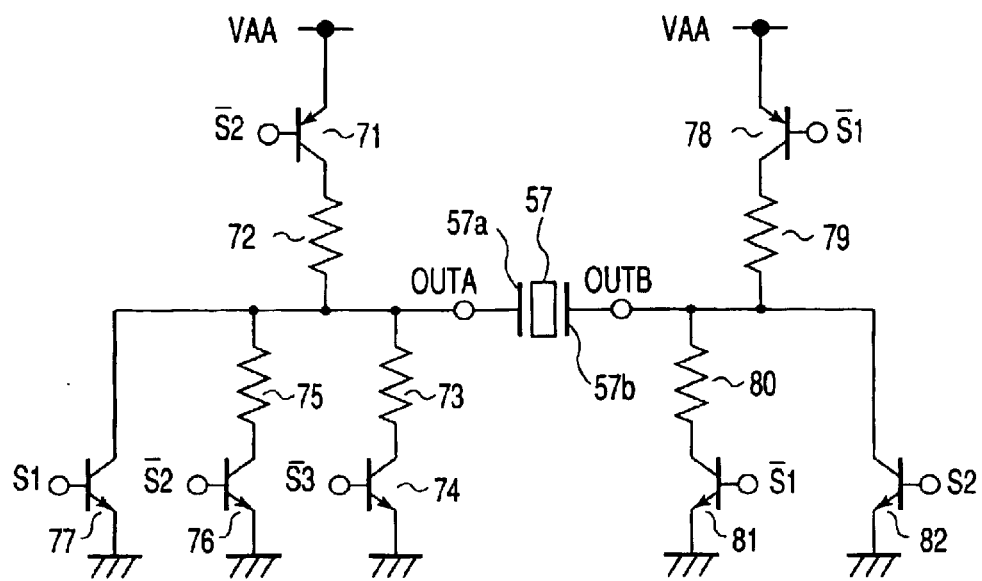
Figure 10:
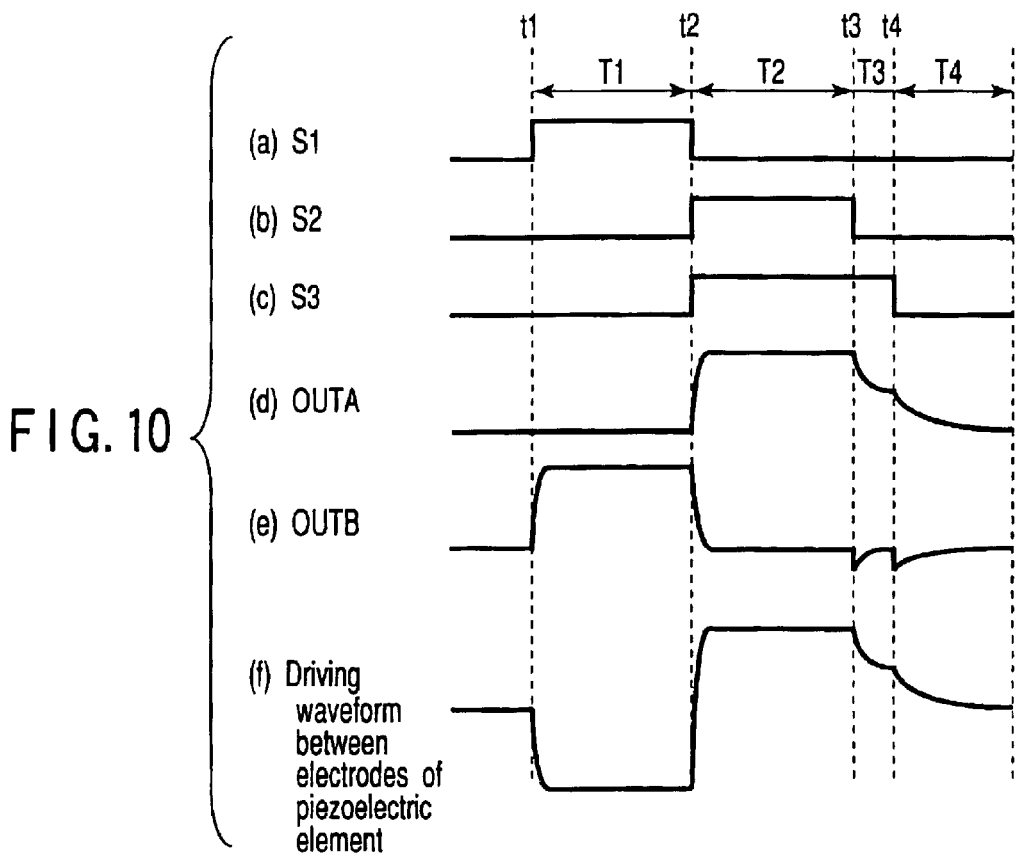
Figure 11:
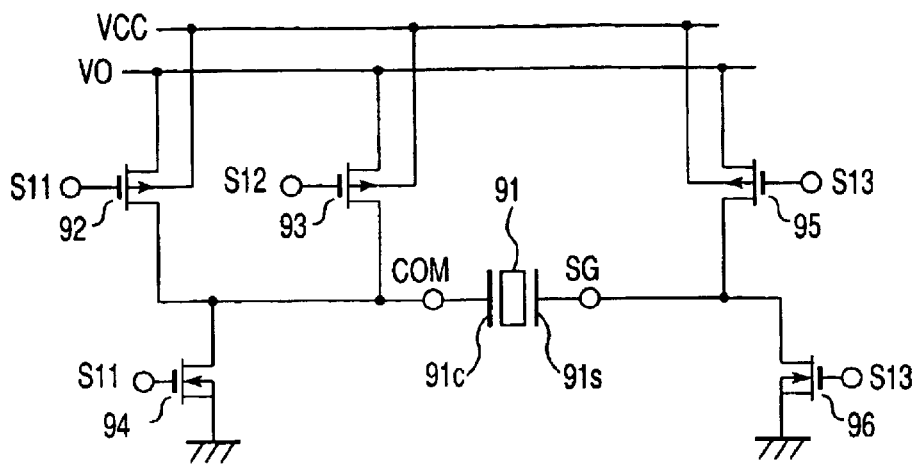
Figure 12:
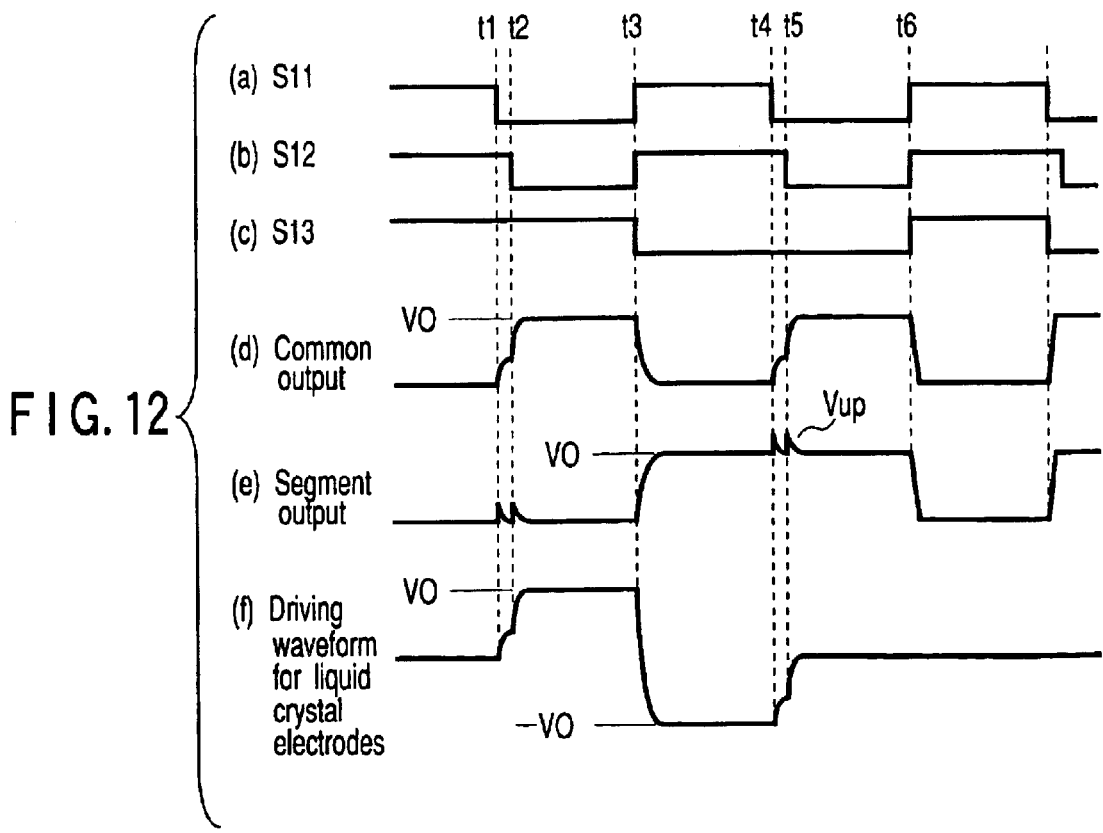
Figure 13:
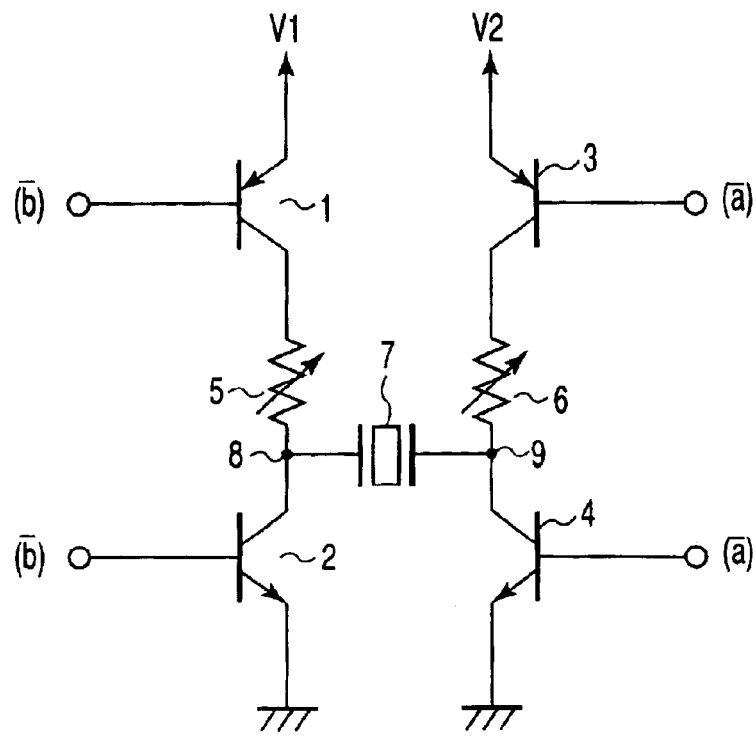
Figure 14:
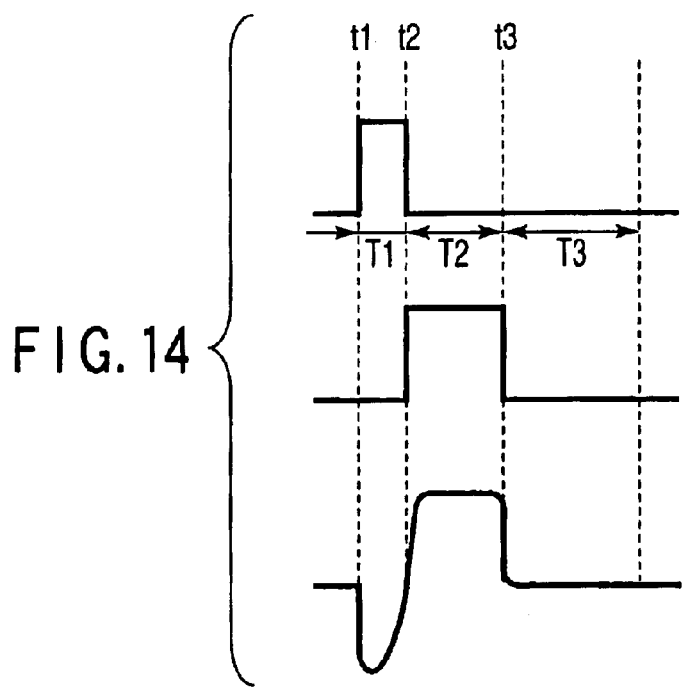
Figure 16:
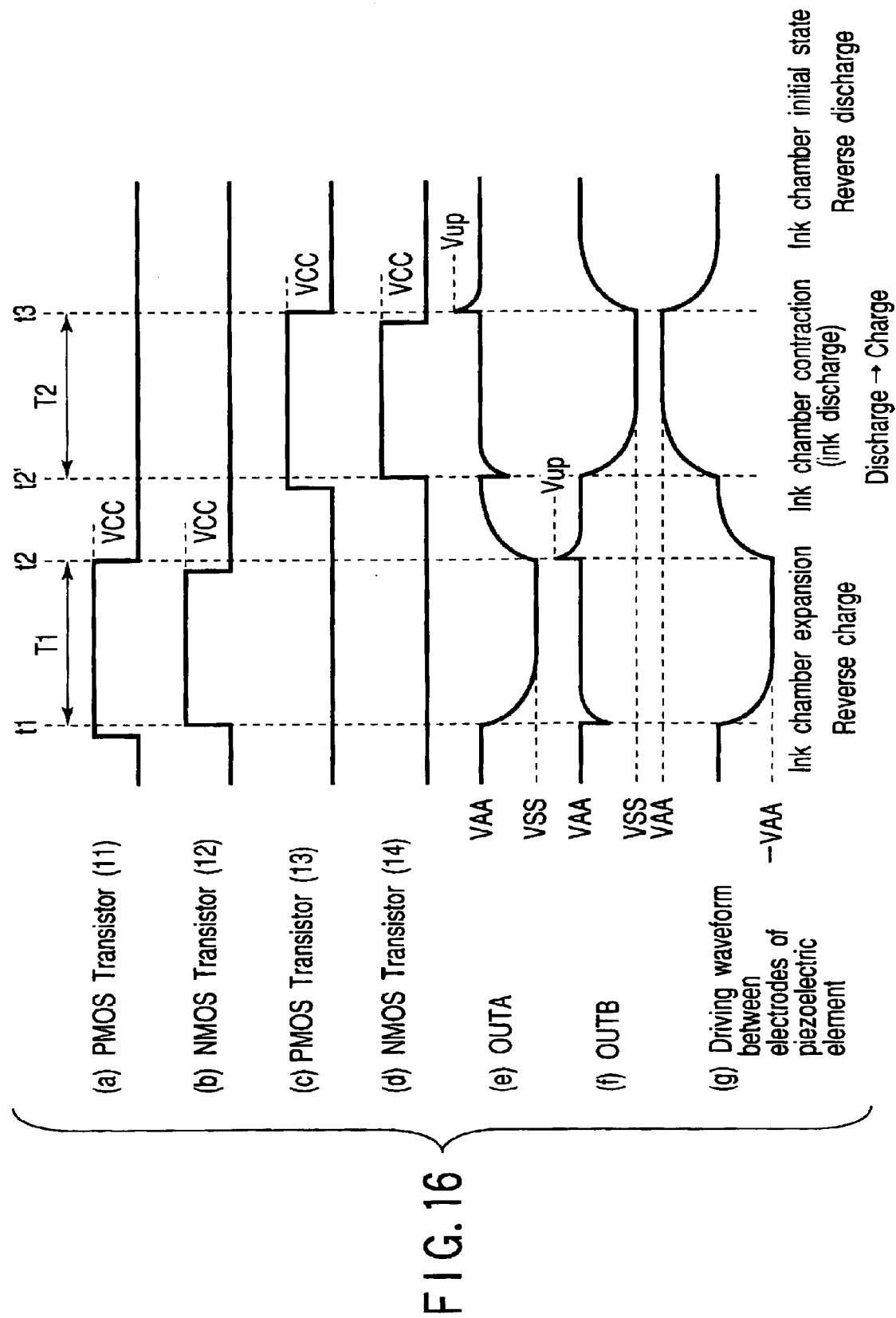

(a)–(d) of FIG. 2 are sectional views useful in explaining the configuration and operation of an ink jet head of a kayser type employed in the first embodiment;

FIG. 3 is a view illustrating the operation timing of MOS transistors, waveforms that occur at output terminals, and a driving waveform that occurs between the electrodes of a piezoelectric element in the first embodiment;

FIG. 4 is a circuit diagram illustrating a second embodiment of the invention;

FIG. 5 is a circuit diagram illustrating a third embodiment of the invention;

FIG. 6 is a view illustrating driving signals, gate-biases applied to MOS transistors, waveforms that occur at output terminals, and a driving waveform that occurs between the electrodes of a piezoelectric element in the third embodiment;

FIG. 7 is a graph useful in comparing the levels of induced voltages Vup assumed in the third embodiment and the prior art when a driving voltage VAA is set at 20V;

FIG. 8 is a graph useful in comparing the levels of induced voltages Vup assumed in the third embodiment and the prior art when the driving voltage VAA is set at 23V;

FIG. 9 is a circuit diagram illustrating a fourth embodiment of the invention;

FIG. 10 is a view illustrating signals used to drive bipolar transistors, waveforms that occur at output terminals, and a driving waveform that occurs between the electrodes of a piezoelectric element in the fourth embodiment;

FIG. 11 is a circuit diagram illustrating a fifth embodiment of the invention;

FIG. 12 is a view illustrating signals used to drive MOS transistors, voltage waveforms that occur at output terminals, and a driving waveform that occurs between the electrodes of a liquid crystal in the fifth embodiment;

FIG. 13 is a circuit diagram illustrating a prior art;

FIG. 14 is a view of waveforms useful in explaining the prior art;

FIG. 15 is a circuit diagram illustrating prior art configured by using MOS transistors; and FIG. 16 is a view illustrating the operation timing of MOS transistors, voltage waveforms that occur at output terminals, and a driving waveform that occurs between the electrodes of a piezoelectric element in the prior art.

DETAILED DESCRIPTION OF THE INVENTION

Embodiments of the present invention will be described with reference to the accompanying drawings.

First Embodiment

A first embodiment is directed to a driving apparatus and method, which employs a piezoelectric element as a capacitive element, and which is applied to an ink jet head that uses the deforming operation of the piezoelectric element to discharge ink from an ink chamber.

A series circuit, formed of a parallel circuit of a high-impedance PMOS transistor 31 and a low-impedance PMOS transistor 32, and a parallel circuit of a high-impedance NMOS transistor 33 and a low-impedance NMOS transistor 34, is connected between a driving voltage VAA and the ground, where the high-impedance PMOS transistor 31 and the low-impedance PMOS transistor 32 are located at the driving voltage VAA side.

A logic circuit 35 that outputs driving signals is provided. Driving signal SP1 from the logic circuit 35 is supplied to a level shifter (L/S) 36, where it is subjected to voltage conversion. After that, the signal SP1 is supplied to the gate of the PMOS transistor 31 via pre-buffer 37. Further, driving signal SP2 from the logic circuit 35 is supplied to a level shifter (L/S) 38, where it is subjected to voltage conversion. After that, the signal SP2 is supplied to the gate of the PMOS transistor 32 via the pre-buffer 37.

Furthermore, driving signal SN1 from the logic circuit 35 is supplied to a level shifter (L/S) 39, where it is subjected to voltage conversion. After that, the signal SN1 is supplied to the gate of the NMOS transistor 33 via the pre-buffer 37. Driving signal SN2 from the logic circuit 35 is supplied to a level shifter (L/S) 40, where it is subjected to voltage conversion. After that, the signal SN2 is supplied to the gate of the NMOS transistor 34 via the pre-buffer 37.

The level shifters 36, 38, 39 and 40 and the pre-buffer 37 are connected between the substrate potential VCC (VCC>VAA) of the PMOS transistors 31 and 32, and the ground. A protective diode 41 for the PMOS transistors 31 and 32 is connected parallel to them between the substrate potential VCC and the junction of the parallel circuits. Similarly, a protective diode 42 for the NMOS transistors 33 and 34 is connected parallel to them between the ground and the junction of the parallel circuits. Parasitic diodes 43 are interposed between the substrate potential VCC and each of the PMOS transistors 31 and 32.

The PMOS transistors 31 and 32, the NMOS transistors 33 and 34, the logic circuit 35, the level shifters 36, 38, 39 and 40, and the pre-buffer 37 configure an A-side driving circuit serving as a first driving circuit.

A series circuit, formed of a parallel circuit of a high-impedance PMOS transistor 44 and a low-impedance PMOS transistor 45, and a parallel circuit of a high-impedance NMOS transistor 46 and a low-impedance NMOS transistor 47, is connected between the driving voltage VAA and the ground, where the high-impedance PMOS transistor 44 and the low-impedance PMOS transistor 45 are located at the driving voltage VAA side.

A logic circuit 48 that outputs driving signals is provided. Driving signal SP1 from the logic circuit 48 is supplied to the gate of the PMOS transistor 44 via a level shifter (L/S) 49 and a pre-buffer 50. Further, driving signal SP2 from the logic circuit 48 is supplied to the gate of the PMOS transistor 45 via a level shifter (L/S) 51 and the pre-buffer 50. Driving signal SN1 from the logic circuit 48 is supplied to the gate of the NMOS transistor 46 via a level shifter (L/S) 52 and the pre-buffer 50. Further, driving signal SN2 from the logic circuit 48 is supplied to the gate of the NMOS transistor 47 via a level shifter (L/S) 53 and the pre-buffer 50.

The level shifters 49, 51, 52 and 53 and the pre-buffer 50 are connected between the substrate potential VCC (VCC>VAA) of the PMOS transistors 44 and 45, and the ground. A protective diode 54 for the PMOS transistors 44 and 45 is connected parallel to them between the substrate potential VCC and the junction of the parallel circuits. Similarly, a protective diode 55 for the NMOS transistors 46 and 47 is connected parallel to them between the ground and the junction of the parallel circuits. Parasitic diodes 56 are interposed between the substrate potential VCC and each of the PMOS transistors 44 and 45.

The PMOS transistors 44 and 45, the NMOS transistors 46 and 47, the logic circuit 48, the level shifters 49, 51, 52 and 53, and the pre-buffer 50 configure a B-side driving circuit serving as a second driving circuit.

The output terminal OUTA of the A-side driving circuit is connected to an electrode 57a of a piezoelectric element 57, and the output terminal OUTB of the B-side driving circuit is connected to an electrode 57b of the piezoelectric element 57.

FIG. 2 shows the structure of an ink jet head of a kayser type, which uses the piezoelectric element 57. A number of long grooves are formed parallel to each other in a substrate 61 and are each covered with an elastic plate 62, thereby forming a number of ink chambers 63. An ink discharge port 64 is provided at an end of each ink chamber 63 for discharging ink therefrom. An ink supply port 65 is provided in an upper rear portion of each ink chamber 63 for supplying ink therein from the outside. The piezoelectric element 57 having its opposite surfaces covered with the electrodes 57a and 57b is secured to the elastic plate 62 in tight contact therewith.

In the A-side driving circuit of the driving apparatus, the signals shown in (a), (b), (c) and (d) of FIG. 3 are supplied to the gates of the PMOS transistor 31, the PMOS transistor 32, the NMOS transistor 33 and the NMOS transistor 34, respectively.

Similarly, in the B-side driving circuit, the signals shown in (e), (f), (g) and (h) of FIG. 3 are supplied to the gates of the PMOS transistor 44, the PMOS transistor 45, the NMOS transistor 46 and the NMOS transistor 47, respectively.

As a result of the supply of these driving signals, in the initial state, the PMOS transistors 31, 32, 44 and 45 are in the ON state, the NMOS transistors 33, 34, 46 and 47 are in the OFF state, and the driving voltage VAA is applied to the electrodes 57a and 57b of the piezoelectric element 57. In this state, at first, the logic circuit 35 of the A-side driving circuit outputs the driving signals SP1 and SP2 for turning off the PMOS transistors 31 and 32, thereby turning off the PMOS transistors 31 and 32.

Subsequently, the logic circuit 35 of the A-side driving circuit outputs the driving signal SN1 for turning on the high-impedance NMOS transistors 33, thereby turning on the NMOS transistor 33. As a result, the piezoelectric element 57 is reversely charged in a high impedance state, whereby the potential of the output terminal OUTA of the A-side driving circuit starts to reduce. After a predetermined time period elapses, the logic circuit 35 of the A-side driving circuit outputs the driving signal SN2 for turning on the low-impedance NMOS transistors 34, thereby turning on the NMOS transistor 34. The piezoelectric element 57 is reversely charged now in a low impedance state, whereby the potential of the output terminal OUTA of the A-side driving circuit is further reduced.

During this operation, an induced minus voltage occurs at the electrode 57b of the piezoelectric element 57 two times, i.e. when the NMOS transistor 33 is turned on, and when the NMOS transistor 34 is turned on. The impedance ratio between the NMOS transistors 33 and 34, and the time period, for which reverse charge is executed by turning on the NMOS transistor 33 first, are set so that the two induced voltages may be of the same peak value.

As stated above, at first, the high-impedance NMOS transistor 33 is turned on, and after a predetermined time period elapses, the low-impedance NMOS transistor 34 is turned on. This control can suppress the peak value of an induced voltage which occurs at the electrode 57b of the piezoelectric element 57, which is determined by the resistance occurring when the NMOS transistors 33 and 34 are turned on at different time points, and by the potential dividing ratio between the resistances of the PMOS transistors 44 and 45 of the B-side driving circuit, assumed when the transistors are in the ON state.

When the piezoelectric element 57 is reversely charged, the element 57 deforms a corresponding ink chamber 63 from the state shown in (a) of FIG. 2 to the state shown in (b) of FIG. 2, i.e. expands the ink chamber 63. After this state is maintained for a predetermined time period, ink is supplied into the ink chamber 63 from the ink supply port 65.

When a predetermined time period has elapsed after that, the NMOS transistors 33 and 34 are turned off. Subsequently, the logic circuit 35 of the A-side driving circuit outputs the driving signal SP1 for turning on the PMOS transistor 31, thereby turning on the PMOS transistor 31. As a result, the piezoelectric element 57 is discharged in a high impedance state, whereby the potential of the output terminal OUTA of the A-side driving circuit starts to increase. After a predetermined time period elapses, the logic circuit 35 of the A-side driving circuit outputs the driving signal SP2 for turning on the low-impedance PMOS transistors 32, thereby turning on the PMOS transistor 32. The piezoelectric element 57 is now discharged in a low impedance state, whereby the potential of the output terminal OUTA of the A-side driving circuit is further increased.

During this operation, an induced plus voltage occurs at the electrode 57b of the piezoelectric element 57 two times, i.e. when the PMOS transistor 31 is turned on, and when the PMOS transistor 32 is turned on. The impedance ratio between the PMOS transistors 31 and 32, and the time period, for which discharge is executed by turning on the PMOS transistor 31 first, are set so that the two induced voltages may be of the same peak value.

As stated above, at first, the high-impedance PMOS transistor 31 is turned on, and after a predetermined time period elapses, the low-impedance PMOS transistor 32 is turned on. This control can suppress the peak value of an induced voltage VupB which occurs at the electrode 57b of the piezoelectric element 57, which is determined by the resistance occurring when the PMOS transistors 31 and 32 are turned on at different time points, and by the potential dividing ratio between the resistances of the PMOS transistors 44 and 45 of the B-side driving circuit, assumed when the transistors are in the ON state. On the other hand, in the prior art, since the piezoelectric element is driven only once in a low impedance state, the peak value of the induced voltage that occurs at a corresponding electrode of the piezoelectric element is inevitably high.

When the potential of the output terminal OUTA of the A-side driving circuit has increased to a certain extent, the logic circuit 48 of the B-side driving circuit outputs the driving signals SP1 and SP2 for turning off the PMOS transistors 44 and 45, thereby turning off the transistors 44 and 45. Thereafter, the logic circuit 48 of the B-side driving circuit outputs the driving signal SN1 for turning on the high-impedance NMOS transistors 46, thereby turning on the NMOS transistor 46. As a result, the piezoelectric element 57 is charged in a high impedance state, whereby, the potential of the output terminal OUTB of the B-side driving circuit starts to reduce. After a predetermined time period elapses, the logic circuit 48 of the B-side driving circuit outputs the driving signal SN2 for turning on the low-impedance NMOS transistor 47, thereby turning on the NMOS transistor 47. The piezoelectric element 57 is now charged in a low impedance state, whereby the potential of the output terminal OUTB of the B-side driving circuit is further reduced.

During this operation, an induced minus voltage occurs at the electrode 57a of the piezoelectric element 57 two times, i.e. when the NMOS transistor 46 is turned on, and when the NMOS transistor 47 is turned on. The impedance ratio between the NMOS transistors 46 and 47, and the time period, for which charge is executed by turning on the NMOS transistor 46 first, are set so that the two induced voltages may be of the same peak value.

As stated above, at first, the high-impedance NMOS transistor 46 is turned on, and after a predetermined time period elapses, the low-impedance NMOS transistor 47 is turned on. This control can suppress the peak value of an induced voltage which occurs at the electrode 57a of the piezoelectric element 57, which is determined by the resistance occurring when the NMOS transistors 46 and 47 are turned on at different time points, and by the potential dividing ratio between the resistances of the PMOS transistors 31 and 32 of the A-side driving circuit, assumed when the transistors are in the ON state. On the other hand, in the prior art, since the piezoelectric element is driven only once in a low impedance state, the peak value of the induced voltage that occurs at a corresponding electrode of the piezoelectric element is inevitably high.

The above-described control can suppress the peak value of the induced voltage even if the NMOS transistors 46 and 47 of the B-side driving circuit are turned on while the output of the A-side driving circuit is discharging. Accordingly, the output of the A-side driving circuit is not easily biased in a minus direction, thereby enhancing the reliability of the circuit.

During the time ranging from the discharge operation to the charge operation, a change twice the driving voltage VAA occurs between the electrodes 57a and 57b of the piezoelectric element 57. As a result, the piezoelectric element 57 shifts the ink chamber 63 from the state shown in (b) of FIG. 2 to the state shown in (c) of FIG. 2, i.e. rapidly shifts the ink chamber from an expanded state to a contracted state, thereby discharging ink from the ink discharge port 64.

After this state is maintained for a predetermined time period, the NMOS transistors 46 and 47 of the B-side driving circuit are turned off. Subsequently, the logic circuit 48 of the B-side driving circuit outputs the driving signal SP1 for turning on the PMOS transistor 44, thereby turning on the PMOS transistor 44. As a result, the piezoelectric element 57 is discharged in a high impedance state, whereby the potential of the output terminal OUTB of the B-side driving circuit starts to increase. After a predetermined time period elapses, the logic circuit 48 of the B-side driving circuit outputs the driving signal SP2 for turning on the low-impedance PMOS transistor 45, thereby turning on the PMOS transistor 45. The piezoelectric element 57 is now discharged in a low impedance state, whereby the potential of the output terminal OUTB of the B-side driving circuit is further increased.

During this operation, an induced plus voltage occurs at the electrode 57a of the piezoelectric element 57 two times, i.e. when the PMOS transistor 44 is turned on, and when the PMOS transistor 45 is turned on. The impedance ratio between the PMOS transistors 44 and 45, and the time period, for which discharge is executed by turning on the PMOS transistor 44 first, are set so that the two induced voltages may be of the same peak value.

As stated above, at first, the high-impedance PMOS transistor 44 is turned on, and after a predetermined time period elapses, the low-impedance PMOS transistor 45 is turned on. This control can suppress the peak value of an induced voltage VupA which occurs at the electrode 57a of the piezoelectric element 57, which is determined by the resistance occurring when the PMOS transistors 44 and 45 are turned on at different time points, and by the potential dividing ratio between the resistances of the PMOS transistors 31 and 32 of the A-side driving circuit, assumed when the transistors are in the ON state. On the other hand, in the prior art, since the piezoelectric element is driven only once in a low impedance state, the peak value of the induced voltage that occurs in a corresponding electrode of the piezoelectric element is inevitably high.

The breakdown voltage of the driving circuit, the substrate potential of each PMOS transistor, the induced voltage Vup need to satisfy the following relation: The breakdown voltage of the driving circuit ≧ the substrate potential of each PMOS transistor ≧ the induced voltage Vup. Further, where the breakdown voltage of the driving circuit and the substrate potential VCC are fixed, if the peak value of the induced voltage Vup is high as in the prior art, the induced voltage Vup exceeds the substrate potential VCC unless the driving voltage VAA is set at a low level. When the induced voltage Vup exceeds the substrate potential VCC, a current may flow into each parasitic diode of each PMOS transistor, thereby turning on a parasitic transistor that uses each parasitic diode as its base.

However, in the apparatus of the embodiment, the induced voltage Vup is suppressed and hence does not exceed the substrate potential VCC of the PMOS transistors even if the driving voltage VAA is not set at a low level. In other words, the driving voltage VAA can be set at a high level, i.e. the driving voltage can be set in a wide range.

Thus, the piezoelectric element 57 is reversely discharged by turning on, first, the PMOS transistor 44 and then the PMOS transistor 45, which are configured in the B-side driving circuit. Then, the piezoelectric element 57 is returned to its initial state in which the electrodes 57a and 57b are set at the same potential. In the initial state, the ink chamber 63 can be at a state shown in (d) of FIG. 2.

As described above, the peak value of the induced voltage can be suppressed at a low level, which occurs in one of the electrodes of the piezoelectric element 57 when charging or discharging the element 57. This enables the driving voltage to be set at a higher level, i.e. the driving voltage can be set in a wide range, thereby enhancing the reliability of the driving apparatus.

Second Embodiment

Also in this embodiment, a piezoelectric element is used as a capacitive element. The second embodiment is directed to a driving apparatus and method applied to an ink jet head that uses the deforming operation of the piezoelectric element to discharge ink from an ink chamber. In this embodiment, reference numerals corresponding to those used in the first embodiment denote similar elements, and hence no detailed description is given thereof.

As shown in FIG. 4, in the second embodiment, the substrate potential VCC of each PMOS transistor is set equal to the driving voltage VAA (VCC=VAA), and the other configuration is the same as those of the first embodiment.

Even if the substrate potential VCC of each PMOS transistor is set equal to the driving voltage VAA so as not to operate parasitic transistors, the peak value of a current flowing into PMOS parasitic diodes can be suppressed. This enables the driving voltage to be set at a higher level, i.e. the driving voltage can be set in a wide range, thereby enhancing the reliability of the driving apparatus.

Third Embodiment

Also in this embodiment, a piezoelectric element is used as a capacitive element. The third embodiment is directed to a driving apparatus and method applied to an ink jet head that uses the deforming operation of the piezoelectric element to discharge ink from an ink chamber. In this embodiment, reference numerals corresponding to those used in the first embodiment denote similar elements, and hence no detailed description is given thereof.

As shown in FIG. 5, in the third embodiment, a series circuit of a PMOS transistor 61 and a NMOS transistor 62 is connected between the driving voltage VAA and the ground, where the PMOS transistor 61 is located at the driving voltage VAA side. Further, the junction of the PMOS transistors 61 and 62 is connected to the output terminal OUTA.

A logic circuit 63 is provided for outputting driving signals. The logic circuit 63 supplies gate voltage control circuit 64 with driving signals CNTP1A, CNTP2A, CNTN1A and CNTN2A.

The driving signal CNTP1A is a signal used to drive the PMOS transistor 61 in a high impedance state. Upon receiving this signal, the gate voltage control circuit 64 drives the PMOS transistor 61 in a high impedance state by applying thereto a gate bias VLp. The driving signal CNTP2A is a signal used to drive the PMOS transistor 61 in a low impedance state. Upon receiving this signal, the gate voltage control circuit 64 drives the PMOS transistor 61 in a low impedance state.

The driving signal CNTN1A is a signal used to drive the NMOS transistor 62 in a high impedance state. Upon receiving this signal, the gate voltage control circuit 64 drives the NMOS transistor 62 in a high impedance state by applying thereto a gate bias VLn. The driving signal CNTN2A is a signal used to drive the NMOS transistor 62 in a low impedance state. Upon receiving this signal, the gate voltage control circuit 64 drives the NMOS transistor 62 in a low impedance state.

Parasitic diodes 65 are interposed between the PMOS transistor 61 and the substrate potential VCC. The PMOS transistor 61, the NMOS transistor 62, the logic circuit 63 and the gate voltage control circuit 64 configure an A-side driving circuit as a first driving circuit.

A series circuit of a PMOS transistor 66 and a NMOS transistor 67 is connected between the driving voltage VAA and the ground, where the PMOS transistor 66 is located at the driving voltage VAA side. Further, the junction of the PMOS transistor 66 and the NMOS transistor 67 is connected to the output terminal OUTB.

A logic circuit 68 is provided for outputting driving signals. The logic circuit 68 supplies gate voltage control circuit 69 with driving signals CNTP1B, CNTP2B, CNTN1B and CNTN2B.

The driving signal CNTP1B is a signal used to drive the PMOS transistor 66 in a high impedance state. Upon receiving this signal, the gate voltage control circuit 69 drives the PMOS transistor 66 in a high impedance state by applying thereto the gate bias VLp. The driving signal CNTP2B is a signal used to drive the PMOS transistor 66 in a low impedance state. Upon receiving this signal, the gate voltage control circuit 69 drives the PMOS transistor 66 in a low impedance state.

The driving signal CNTN1B is a signal used to drive the NMOS transistor 67 in a high impedance state. Upon receiving this signal, the gate voltage control circuit 69 drives the NMOS transistor 67 in a high impedance state by applying thereto a gate bias VLn. The driving signal CNTN2B is a signal used to drive the NMOS transistor 67 in a low impedance state. Upon receiving this signal, the gate voltage control circuit 69 drives the NMOS transistor 67 in a low impedance state.

Parasitic diodes 70 are interposed between the PMOS transistor 66 and the substrate potential VCC. The PMOS transistor 66, the NMOS transistor 67, the logic circuit 68 and the gate voltage control circuit 69 configure a B-side driving circuit as a second driving circuit.

In the driving apparatus of the third embodiment, the logic circuit 63 of the A-side driving circuit supplies the gate voltage control circuit 64 with the driving signal CNTP1A, CNTP2A, CNTN1A and CNTN2A shown in (a), (b), (c) and (d) of FIG. 6, respectively.

Further, in the driving apparatus of the third embodiment, the logic circuit 68 of the B-side driving circuit supplies the gate voltage control circuit 69 with the driving signal CNTP1B, CNTP2B, CNTN1B and CNTN2B shown in (e), (f), (g) and (h) of FIG. 6, respectively.

As a result, in the A-side driving circuit, a gate bias P1GA applied to the PMOS transistor 61 varies as shown in (i) of FIG. 6, and a gate bias N1GA applied to the NMOS transistor 62 varies as shown in (j) of FIG. 6. Further, in the B-side driving circuit, a gate bias P1GB applied to the PMOS transistor 66 varies as shown in (k) of FIG. 6, and a gate bias N1GB applied to the NMOS transistor 67 varies as shown in (l) of FIG. 6.

In the above-described configuration, when turning on the NMOS transistor 62 of the A-side driving circuit, the transistor 62 is first turned on in a high impedance state by applying thereto the gate bias VLn, and is then turned on in a low impedance state. Accordingly, even if an induced minus voltage occurs at the electrode 57b of the piezoelectric element 57, the peak value of the induced voltage can be suppressed. Further, when turning on the PMOS transistor 61 of the A-side driving circuit, the transistor 62 is first turned on in a high impedance state by applying the gate bias VLp, and is then turned on in a low impedance state. Therefore, even if an induced plus voltage occurs at the electrode 57b of the piezoelectric element 57, the peak value of the induced voltage can be suppressed.

Similarly, when turning on the NMOS transistor 67 of the B-side driving circuit, the transistor 67 is first turned on in a high impedance state by applying thereto the gate bias VLn, and is then turned on in a low impedance state. Accordingly, even if an induced minus voltage occurs at the electrode 57a of the piezoelectric element 57, the peak value of the induced voltage can be suppressed. Further, when turning on the PMOS transistor 66 of the B-side driving circuit, the transistor 66 is first turned on in a high impedance state by applying the gate bias VLp, and is then turned on in a low impedance state. Therefore, even if an induced plus voltage occurs at the electrode 57a of the piezoelectric element 57, the peak value of the induced voltage can be suppressed.

As state above, also in the third embodiment, the peak value of the induced voltage that occurs when charging or discharging the piezoelectric element 57 can be suppressed. This enables the driving voltage to be set at a higher level, i.e. the driving voltage can be set in a wide range, thereby enhancing the reliability of the driving apparatus.

A description will now be given of a specific example. To facilitate the explanation, calculation is executed by using resisters with which replace MOS transistors.

For example, assuming that the capacitance of the piezoelectric element 57 is 500 pF, the driving voltage VAA is 20 V, and the electric charge accumulated in the piezoelectric element 57 is discharged by 90% in $0.2\mu$ sec. or less, a PMOS transistor of 85Ω is used in prior art. When executing discharge to the driving voltage 20 V side, the induced voltage which occurred at the electrode opposed to the discharging side electrode, i.e. the induced voltage Vup, is about 10 V. As indicated by the broken line of FIG. 7, it is necessary to set the substrate potential VCC of the PMOS transistor at 30 V, which 10 V is added to the driving voltage VAA of 20 V, or more.

On the other hand, in the apparatus of the present invention, discharge is started first by using a high impedance PMOS transistor, i.e. a 250Ω PMOS transistor. On the opposite side, a MOS transistor is in the ON state at about 71.5Ω that is obtained by synthesizing 250Ω (high impedance) and 100Ω (low impedance). Accordingly, the induced voltage Vup that occurs in an electrode on the opposite side is slightly less than 6 V, which is obtained by dividing the driving voltage VAA 20 V by two resistors of 250Ω and 71.5Ω connected in parallel.

After the piezoelectric element is discharged for 50 nsec at a high impedance of 250Ω, a low impedance MOS transistor, i.e. a 100Ω MOS transistor, is turned on, whereby the piezoelectric element continues to be discharged at 71.5Ω that is obtained by synthesizing 250Ω and 100Ω. The induced voltage Vup, obtained when the 100Ω MOS transistor is turned on, is slightly less than 6 V, since a voltage, which remains after discharge is executed by using the 250Ω MOS transistor, is divided by two resistors of 71.5Ω connected in parallel.

As described above, although in the apparatus of the embodiment, the induced voltage Vup occurs twice, both the Vup voltages are slightly less than 6 V. Accordingly, as indicated by the solid line in FIG. 7, it is sufficient if the substrate potential VCC of the PMOS transistor is set at a value obtained by adding a value slightly less than 6 V (according to actual calculation, 5.83 V) to the driving voltage VAA of 20 V, i.e. set at 25.83 V.

Accordingly, where the substrate potential VCC of the PMOS transistor is set at 30 V equal to that in the prior art, even if the driving voltage VAA is set at 23 V, the induced voltage Vup is as low as 6.71 V. Therefore, the total voltage is less than 30 V (23 V+6.71 V=29.71 V). In other words, in a case where the substrate potential VCC is set at 30 V as in the prior art, the driving voltage VAA can be set at 23 V, which is 3 V higher than the conventional driving voltage VAA.

Fourth Embodiment

Also in this embodiment, a piezoelectric element is used as a capacitive element. The fourth embodiment is directed to a driving apparatus and method applied to an ink jet head that uses the deforming operation of the piezoelectric element to discharge ink from an ink chamber. In this embodiment, reference numerals corresponding to those used in the first embodiment denote similar elements, and hence no detailed description is given thereof.

The fourth embodiment employs bipolar transistors in place of the MOS transistors. Specifically, as shown in FIG. 9, the emitter of the first PNP transistor 71 is connected to the VAA terminal of the driving voltage. The collector of the first transistor 71 is connected to the collector of the second NPN transistor 74 via a resistor 72 and also via a resistor 73 that provides a signal fall characteristic. The emitter of the second NPN transistor 74 is grounded.

A series circuit of the resistor 73 and the second NPN transistor 74 is connected parallel to the third NPN transistor 76 via a high value resistor 75, and is connected further parallel to the fourth NPN transistor 77.

The transistors 71, 74, 76 and 77 and the resistors 72, 73 and 75 configure a first driving circuit. The junction of the resistors 72, 73 and 75 is connected to the output terminal OUTA, which is connected to the electrode 57a of the piezoelectric element 57.

Further, the emitter of the fifth PNP transistor 78 is connected to the VAA terminal of the driving voltage. The collector of the fifth transistor 78 is connected to the collector of the sixth NPN transistor 81 via a resistor 79 and also via a resistor 80. The emitter of the sixth NPN transistor 81 is grounded. A series circuit of the resistor 80 and the sixth NPN transistor 81 is connected parallel to the seventh NPN transistor 82.

The transistors 78, 81 and 82 and the resistors 79 and 80 configure a second driving circuit. The junction of the resistors 79 and 80 is connected to the output terminal OUTB, which is connected to the other electrode 57b of the piezoelectric element 57.

A signal /S2 obtained by inverting a signal S2 shown in (b) of FIG. 10 is input to the base of the first transistor 71. A signal /S3 obtained by inverting a signal S3 shown in (c) of FIG. 10 is input to the base of the second transistor 74. The signal /S2 obtained by inverting the signal S2 shown in (b) of FIG. 10 is also input to the base of the third transistor 76. A signal S1 shown in (a) of FIG. 10 is input to the base of the fourth transistor 77.

Further, a signal /S1 obtained by inverting the signal S1 shown in (a) of FIG. 10 is input to the bases of the fifth and sixth transistors 78 and 81. The signal S2 shown in (b) of FIG. 10 is input to the base of the seventh transistor 82.

In this configuration, when the signal S1 rises at time point t1, the second, third, fourth and fifth transistors 74, 76, 77 and 78 are turned on and the first, sixth and seventh transistors 71, 81 and 82 are turned off, since the signals S2 and S3 are at low level at the time point t1. As a result, the piezoelectric element 57 starts to be reversely charged, thereby raising a voltage at the output terminal OUTB, i.e. in the electrode 57b, as shown in (e) of FIG. 10. This expands the ink chamber 63.

At time point t2 after time period T1 elapses from the time point ti, the signal S1 falls and the signals S2 and S3 rise. At this time, the first, sixth and seventh transistors 71, 81 and 82 are turned on and the second, third, fourth and fifth transistors 74, 76, 77 and 78 are turned off. As a result, the piezoelectric element 57 is discharged and then charged. More specifically, as shown in (d) and (e) of FIG. 10, the potential of the output terminal OUTA (electrode 57a) rises, and the potential of the output terminal OUTB (electrode 57b) falls. Accordingly, the ink chamber 63 rapidly shifts from the expanded state to a contracted state. This contracted state is continued for time period T2, and ink is discharged from the ink discharge port 64 of the ink chamber 63.

At time point t3 after time period T2 elapses from the time point t2, the signal S2 falls, whereby the first and seventh transistors 71 and 82 are turned off, and the third transistor 76 is turned on. Accordingly, the piezoelectric element 57 is reversely discharged via the high value resistor 75. At time point t4 after time period T3 elapses from the time point t3, the signal S3 falls, whereby the second transistor 74 is turned on and hence the piezoelectric element 57 is reversely discharged with a predetermined fall characteristic via a parallel circuit of the high value resistor 75 and the resistor 73, and is returned to its initial state after time period T4 elapses.

As a result of the above-mentioned operations, a driving waveform as shown in (f) of FIG. 10 is applied between the electrodes of the piezoelectric element 57, thereby discharging ink from the ink chamber 63.

As described above, when reversely discharging the piezoelectric element 57, the element 57 is reversely discharged first via the high value resistor 75 and then continued to be reversely discharged with the resistance reduced. This operation suppresses the peak value of an induced minus voltage that occurs at the output terminal OUTB (i.e. at the electrode 57b), as is shown in (e) of FIG. 10.

In summary, also in this embodiment, the peak value of the induced voltage that occurs in one of the electrodes of the piezoelectric element 57, when charging the element 57, can be suppressed at a low level. This enables the driving voltage to be set at a higher level, i.e. the driving voltage can be set in a wide range, thereby enhancing the reliability of the driving apparatus.

This embodiment employs the high value resistor 75, and the resistor 73 that provides a predetermined fall characteristic. The transistors 76 and 74 are selectively switched from each other, thereby switching the presently-used resistor to perform switchover from a high impedance state to a low impedance state. However, the present invention is not limited to this configuration. The configuration may be modified such that a series circuit of a resistor and a transistor is prepared, and switchover from a high impedance state to a low impedance state is performed by suppressing the base current of the transistor at the start of discharge to thereby drive the transistor at a high impedance, and increasing the base current after a predetermined period of time to thereby drive the transistor at a low impedance.

Fifth Embodiment

This embodiment employs a liquid crystal as a capacitive element.

FIG. 11 shows a configuration of a static driving system for a liquid crystal. In FIG. 11, reference numeral 91 denotes a liquid crystal as a capacitive element, which includes a segment electrode 91s and a common electrode 91c.

A series circuit formed of a parallel circuit of a high-impedance PMOS transistor 92 and a low-impedance PMOS transistor 93, and a low-impedance NMOS transistor 94 is connected between a driving voltage V0 and the ground. The junction of the parallel circuit and the NMOS transistor 94 is connected to a common output terminal COM. The common output terminal COM is connected to the common electrode 91c of the liquid crystal 91.

A series circuit of a low-impedance PMOS transistor 95 and a low-impedance NMOS transistor 96 is connected between the driving voltage V0 and the ground. The junction of the transistors 95 and 96 is connected to a segment output terminal SG. The segment output terminal SG is connected to the segment electrode 91s of the liquid crystal 91. VCC indicates the substrate potential of each PMOS transistor.

In the case of the static driving system, a voltage is applied between the segment electrode 91s and the common electrode 91c, which are used to display data, during the time for which display is executed. If a liquid crystal display is powered by a direct current, an electrochemical reaction is generated in the liquid crystal cells, thereby significantly reducing the life duration of the display. To avoid this, square-wave voltages with a peak wave value of V0 and phases shifted by π/2 from each other are applied to the common electrode 91c and the segment electrode 91s, respectively, as is shown in (d) and (e) of FIG. 12. Since the liquid crystal 91 does not have a polarity, voltages of ±V0 are applied to the liquid crystal 91. As a result, the average voltage applied to the liquid crystal 91 is 0 V, which prevents degradation of the liquid crystal.

A signal S11 shown in (a) of FIG. 12 is input to the gates of the PMOS transistor 92 and NMOS transistor 94. A signal S12 shown in (b) of FIG. 12 is input to the gate of the PMOS transistor 93. A signal S13 shown in (c) of FIG. 12 is input to the gates of the PMOS transistor 95 and NMOS transistor 96.

In this configuration, in the initial state, the signals S11, S12 and S13 are set at high level, the PMOS transistors 92, 93 and 95 are in the OFF state, and the NMOS transistors 94 and 96 are in the ON state. At first, at time point t1, the signal S1 falls, the PMOS transistor 92 is turned on, and the NMOS transistor 94 is turned off. At this time, charging of the liquid crystal 91 is started from the common electrode side in a high impedance state, thereby raising the voltage of the common output terminal as shown in (d) of FIG. 12. When the signal S12 falls at time point t2 that is a predetermined time period later than the time point t1, the PMOS transistor 93 is turned on. The liquid crystal 91 is further charged rapidly in a low impedance state, and then the potential of the common electrode 91c becomes constant at the voltage V0. At this time, an induced plus voltage occurs at the segment electrode 91s. Since, however, the segment electrode 91s is at 0 V before the occurrence of the induced plus voltage, the induced voltage does not significantly influence the circuit.

Thereafter, at time point t3, the signals S11 and S12 rise and the signal S13 falls, whereby the PMOS transistors 92 and 93 and the NMOS transistor 96 are turned off, and the NMOS transistor 94 and the PMOS transistor 95 are turned on. At this time, discharging and charging of the liquid crystal 91 are started from the common electrode side and the segment electrode side, respectively, as shown in (d) and (e) of FIG. 12. Then the potential of the segment electrode 91s becomes constant at the voltage V0.

After that, at time point t4, the signal S11 falls, whereby the PMOS transistor 92 is turned on and the NMOS transistor 94 is turned off. At this time, discharging of the liquid crystal 91 is started from the common electrode side in a high impedance state, thereby raising the voltage of the common output terminal as shown in (d) of FIG. 12. At time point t5 after a predetermined time period elapses from the time point t4, the signal S12 rises, thereby turning on the PMOS transistor 93. As a result, the liquid crystal 91 is further discharged rapidly in a low impedance state, and then the potential of the common electrode 91c becomes a constant level at the voltage V0. At this time, an induced plus voltage Vup occurs at the segment electrode 91s.

Since the segment electrode 91s is at the electric potential of V0 before the occurrence of the induced voltage, the induced voltage is added to V0. However, in this case, charging is executed first in a high impedance state and then in a low impedance state, and therefore the peak value of the induced voltage Vup, which occurs twice, is suppressed.

At time point t6, all the signals S11, S12 and S13 are raised, and the liquid crystal is returned to its initial state.

As described above, also in the case of using a liquid crystal as a capacitive element, the peak value of the induced voltage that occurs at an electrode can be suppressed. This enables the driving voltage V0 to be set at a higher level, i.e. the driving voltage can be set in a wide range, thereby enhancing the reliability of the driving apparatus.

Also in this embodiment, only a single PMOS transistor may be connected to the common electrode, thereby executing switching from a high impedance state to a low impedance state by controlling the gate voltage of the transistor.

In each of the above-described embodiments, the impedance of the driving circuit is switched in two stages from a high impedance to a low impedance, when charging or discharging the piezoelectric element or the liquid crystal. However, the present invention is not limited to this. For example, the impedance of the driving circuit may be switched in three or more stages from a high impedance to a low impedance. In this case, the occasion of occurrence of the induced voltage Vup during the charging or discharging operation is increased, and hence the peak value of the induced voltage can be further reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of driving a capacitive element having electrodes utilizing driving circuits, comprising:

charging the capacitive element, while driving and controlling the electrodes of the capacitive element, by setting one of the driving circuits for varying one of electrode potentials first at a high impedance and then at a low impedance while the one of the driving circuits is on; and discharging the capacitive element, while driving and controlling the electrodes of the capacitive element, by setting one of the driving circuits for varying one of electrode potentials first at a high impedance and then at a low impedance while the one of the driving circuits is on.

2. The method according to claim 1, wherein:

timing of switching the one of the driving circuits from the high impedance state to the low impedance state is set such that a peak voltage, which occurs at the other electrode opposed to the one electrode having a potential thereof varied at the start of charging the capacitive element in the high impedance state, is equal to a peak voltage, which occurs at the other electrode opposed to the one electrode having a potential thereof varied at the start of charging the capacitive element in the low impedance state; and timing of switching the one of the driving circuits from the high impedance state to the low impedance state is set such that a peak voltage, which occurs at the other electrode opposed to the one electrode having a potential thereof varied at the start of discharging the capacitive element in the high impedance state, is equal to a peak voltage that occurs at the other electrode opposed to the one electrode having a potential thereof varied at the start of discharging the capacitive element in the low impedance state.

3. A driving apparatus for a capacitive element having electrodes, comprising:

a first driving circuit including a switch element and having an output thereof applied to one of the electrodes of the capacitive element; and a second driving circuit including a switch element and having an output thereof applied to another of the electrodes of the capacitive element, wherein when the capacitive element is charged/discharged by controlling the outputs of the first and second driving circuits, the capacitive element is charged/discharged by setting one of the driving circuits for varying one of electrode potentials first at a high impedance and then at a low impedance while the one of the driving circuits is on.

4. The driving apparatus according to claim 3, wherein the first driving circuit includes a plurality of switch elements, and the second driving circuit includes a plurality of switch elements, and an impedance of each of the first and second driving circuits is controlled by switching the switch elements that are included in one of the first and second driving circuits and are configured to turn on the one of the first and second driving circuits, the one of the first and second driving circuits varying a potential of a corresponding one of the electrodes.

5. The driving apparatus according to claim 3, wherein:

the first driving circuit includes a first MOS transistor as a switch element, and a first control circuit that controls a gate voltage of the first MOS transistor;

the second driving circuit includes a second MOS transistor as a switch element, and a second control circuit that controls a gate voltage of the second MOS transistor; and one of the control circuits controls the gate voltage of a corresponding one of the MOS transistors included in a corresponding one of the first and second driving circuits, which varies the potential of a corresponding one of the electrodes, such that said corresponding one of the MOS transistors is turned on first in a high impedance state and then in a low impedance state.

6. The driving apparatus according to claim 3, wherein:

the first driving circuit includes a first bipolar transistor as the switch element, and has a resistor between the output of the first driving circuit and a collector of the first bipolar transistor, and the second driving circuit includes a second bipolar transistor as the switch element, and has a resistor between the output of the second driving circuit and a collector of the second bipolar transistor.

7. The driving apparatus according to claim 3, wherein:

timing of switching the one of the first and second driving circuits from the high impedance state to the low impedance state is set such that a peak voltage, which occurs at the other electrode opposed to the one electrode having a potential thereof varied at the start of charging the capacitive element in the high impedance state, is equal to a peak voltage, which occurs at the other electrode opposed to the one electrode having a potential thereof varied at the start of charging the capacitive element in the low impedance state; and timing of switching the one of the first and second driving circuits from the high impedance state to the low impedance state is set such that a peak voltage, which occurs at the other electrode opposed to the one electrode having a potential thereof varied at the start of discharging the capacitive element in the high impedance state, is equal to a peak voltage that occurs at the other electrode opposed to the one electrode having a potential thereof varied at the start of discharging the capacitive element in the low impedance state.

* * * * *